(12) United States Patent
Gupta et al.

(10) Patent No.: US 12,045,025 B1
(45) Date of Patent: Jul. 23, 2024

(54) PARTITIONING ASSETS FOR ELECTRIC GRID CONNECTION MAPPING

(71) Applicant: X Development LLC, Mountain View, CA (US)

(72) Inventors: Ananya Gupta, San Francisco, CA (US); Phillip Ellsworth Stahlfeld, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 18/179,452

(22) Filed: Mar. 7, 2023

Related U.S. Application Data

(63) Continuation of application No. PCT/US2022/074829, filed on Aug. 11, 2022.

(60) Provisional application No. 63/232,052, filed on Aug. 11, 2021.

(51) Int. Cl.
  *G05B 19/042* (2006.01)
  *G06N 20/00* (2019.01)

(52) U.S. Cl.
  CPC .......... *G05B 19/042* (2013.01); *G06N 20/00* (2019.01); *G05B 2219/2639* (2013.01)

(58) Field of Classification Search
  CPC .......... G05B 19/042; G05B 2219/2639; G06N 20/00
  USPC ....................................................... 700/291
  See application file for complete search history.

(56) References Cited

U.S. PATENT DOCUMENTS

2021/0141969 A1  5/2021  Stahlfeld et al.
2023/0050693 A1*  2/2023  Gupta ............... H02J 13/00002

FOREIGN PATENT DOCUMENTS

EP  3842813  6/2021

OTHER PUBLICATIONS

International Search Report and Written Opinion in International Appln. No. PCT/US2022/074829, dated Dec. 12, 2022, 19 pages.

\* cited by examiner

*Primary Examiner* — Mohammad Ali
*Assistant Examiner* — Saad M Kabir
(74) *Attorney, Agent, or Firm* — Fish & Richardson P.C.

(57) ABSTRACT

Methods, computer systems, and apparatus, including computer programs encoded on computer storage media, for training a machine-learning model for predicting event tags. The system obtains asset data for an electric power distribution system in a geographic area. The asset data includes: for each of a plurality of electrical assets of the electrical power distribution system, data indicating one or more characteristics of the electrical asset. The system further obtains sensor data for the electric power distribution system. The sensor data includes measurement data from a plurality of electric sensors. The system generates, by processing the asset data and the sensor data, partition data that includes, for each of the plurality of electrical assets, an assignment that assigns the electrical asset to one of a set of feeder networks.

17 Claims, 6 Drawing Sheets

PARTITIONING ASSETS FOR ELECTRIC GRID CONNECTION MAPPING

CROSS-REFERENCE TO RELATED APPLICATION

This application is a continuation of International Application No. PCT/US2022/074829, filed Aug. 11, 2022, which claims priority to U.S. Provisional Patent Application No. 63/232,052, filed on Aug. 11, 2021.

BACKGROUND

This specification generally relates to determining the topologies of electric power grids.

Virtual electric grid models are used to evaluate and predict operations and potential faults in an electric grid. Electric grid models can include mappings of electrical connections between power sources, nodes, and loads. For example, electric grid models can include data representing cable connections between loads and transformers, between substations and transformers, from one load to another, and from one transformer to another.

SUMMARY

This specification describes methods, computer systems, and apparatus, including computer programs encoded on computer storage media, for accurately mapping connections of assets and loads of an electric grid.

Electric power grids can contain large quantities of wires, poles, and other expensive electrical assets, e.g., transformers, capacitors, and switches. A fundamental building block of an electric distribution network includes feeders. A feeder includes a set of powerlines that transmit electricity from a generating station/substation to distribution points such as loads and can include a number of electrical assets. For example, one feeder might be used to connect a group of houses on one side of a street to a nearby substation.

Determining topologies of an electric power grid is a process of determining respective locations of, and corresponding connections between, the assets and loads that are included in the electric power grid, including the connection topologies of multiple feeder networks. A challenge for accurately mapping electric grid connections from only geospatial data (e.g., from an overhead areal image and other geospatial data sources) is that, in many instances, different feeder networks geographically overlap each other. The complexity of the electric power network (e.g., connection paths obscured by obstacles and paths of underground connections), combined with the multiple overlapped feeder networks, causes the modeling to be error-prone. In particular, when determining connection topologies of electric power grid based on image-based data, e.g., from top-view aerial images and street-view photographs, multiple different feeder networks are often erroneously inferred to as being part of the same feeder network.

This specification provides a system and method that leverage both sensor data and geospatial data for accurately mapping connections of assets and loads of an electric grid. The disclosed techniques can be used to generate accurate connection mapping models for electric grids including multiple overlapping feeder networks.

In one innovative aspect, this specification describes a method for generating a representation of an electric power grid. The method can be implemented by a system including one or more computers. The system obtains asset data for an electric power distribution system in a geographic area. The asset data includes, for each of a plurality of electrical assets of the electrical power distribution system, data indicating one or more characteristics of the electrical assets. For example, the system can obtain the asset data by processing an overhead aerial image of the geographic area (and optionally additional street view images of the area) using an analysis model to detect power lines, poles, and electrical assets including, e.g., transformers, capacitors, switches, reclosers, fuses, insulators, risers, and voltage regulators.

The system further obtains sensor data for the electric power distribution system. The sensor data includes measurement data from a plurality of electric sensors, including, but not limited to, utility meter sensors, powerline sensors, Advanced Metering Infrastructure (AMI) sensors, and sensors having high-frequency sampling rates and capable of measuring temporal waveforms of electric parameters such as current and voltage waveforms.

The system can generate, based on the asset data and the sensor data, partition data that includes an assignment assigning each electrical asset to one of a set of feeder networks. For example, the system can perform a correlation analysis of the measurement data from each of the plurality of electric sensors to generate a correlation result between each pair of the plurality of electric sensors. The system can generate the partition data based on the correlation results and association data that indicates connectivity or geographical associations between each of the plurality of electric sensors with one of the electrical assets. In another example, the system can generate a model input based on the asset data and the sensor data, and process the model input using a partition machine learning model to generate the partition data.

For generating the grid connection mapping, the system can generate a model input based on the asset data and the partition data, and process the model input using a connectivity machine learning model (e.g., a graph neural network) to generate an output that includes data characterizing network connectivity characteristics for the plurality of electrical assets.

In another aspect, the specification provides a system including one or more computers and one or more storage devices storing instructions that when executed by the one or more computers, cause the one or more computers to perform the above-described method for generating a representation of an electric power grid.

In another aspect, the specification provides one or more computer-readable storage media storing instructions that, when executed by one or more computers, cause the one or more computers to perform the operations of the above-described method for generating a representation of an electric power grid.

The subject matter described in this specification can be implemented in particular embodiments so as to realize one or more of the following advantages.

The described techniques leverage both sensor data and geospatial data to overcome the existing challenges (e.g. overlapping feeder networks, obstacle obscuring connection paths, and underground connection paths) for mapping electric grid connections, and provide electric power grid models with improved accuracy. In particular, the described techniques can be used to generate accurate connection mapping models for electric grids including multiple overlapping feeder networks. The accurate connection mapping models can be used to evaluate and predict operations and potential faults in an electric grid.

BRIEF DESCRIPTION OF THE DRAWINGS

Like reference numbers and designations in the various drawings indicate like elements.

DETAILED DESCRIPTION

This specification provides a system and method that leverage both sensor data and geospatial data for accurately mapping connections of electrical assets and loads of an electric grid. The disclosed techniques can be used to generate accurate connection mapping models for electric grids including multiple overlapping feeder networks.

Figure 1A:
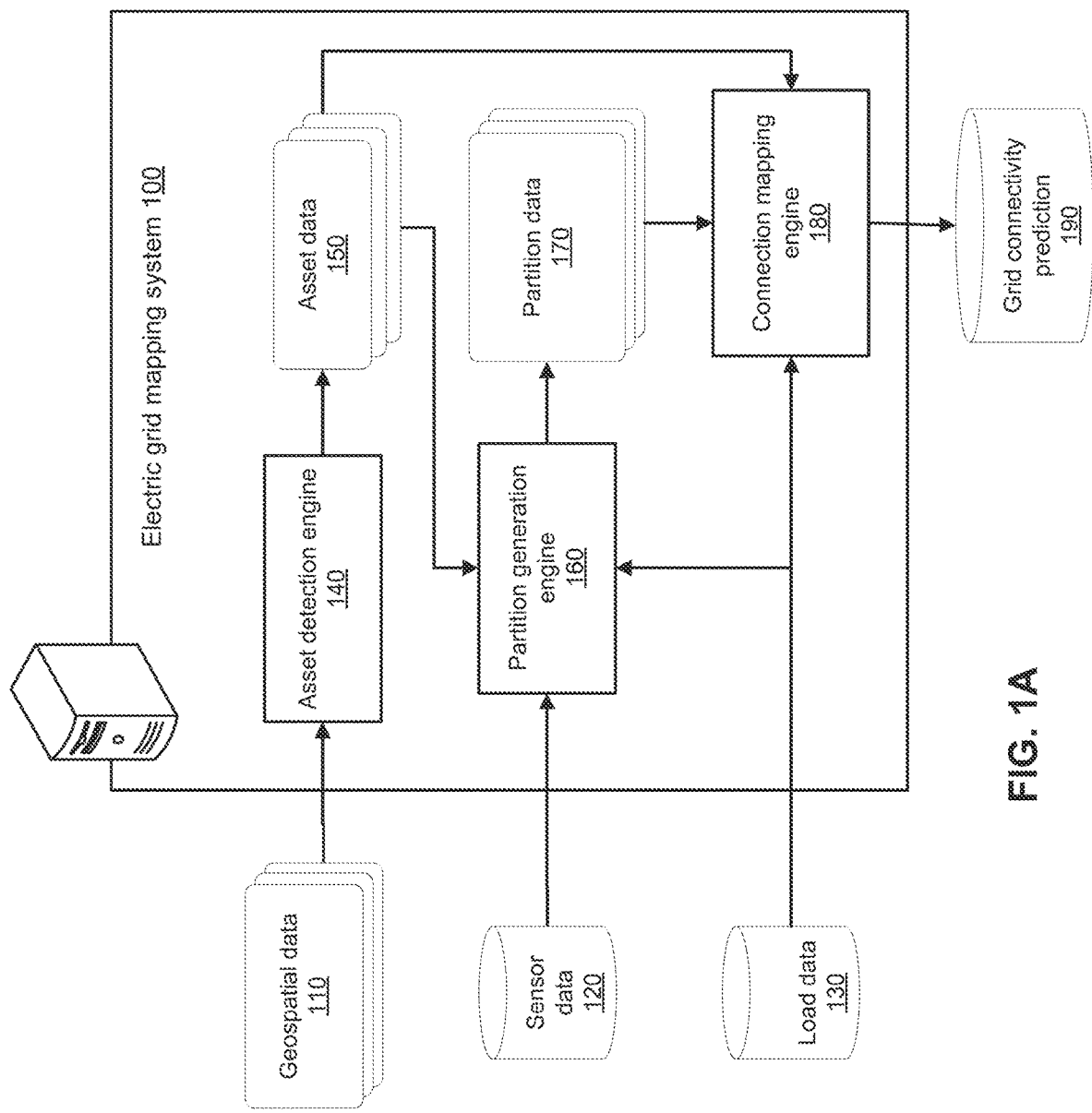
FIG. 1A shows an example system for mapping connections of an electric grid.

FIG. 1A shows an example system 100 for mapping connections of an electric grid. The system 100 is an example of a system implemented as computer programs on one or more computers in one or more locations, in which the systems, components, and techniques described below can be implemented.

In general, the system 100 obtains asset data 150 for a plurality of electrical assets in an electric power distribution system in a geographic area, and generates partition data 170 that specifies how to group the electrical assets into partitions. In particular, the system 100 can group electrical assets belonging to the same feeder network into the same partition.

In this specification, a feeder network refers to a portion of an electric distribution network that is connected to the same feeder. The feeder is configured to deliver power from a distribution substation to distribution transformers. The feeder can be one of multiple feeders connected to the distribution substation. As an example, the feeder can begin at a feeder breaker at the distribution substation and be routed to a nearby pole. The feeder network can connect multiple electrical assets, including, e.g., transformers, capacitors, switches, reclosers, fuses, insulators, risers, voltage regulators, etc., and delivers electricity to multiple loads at multiple service locations (e.g., residential or industrial locations) with a particular network connectivity topology.

Figure 1B:
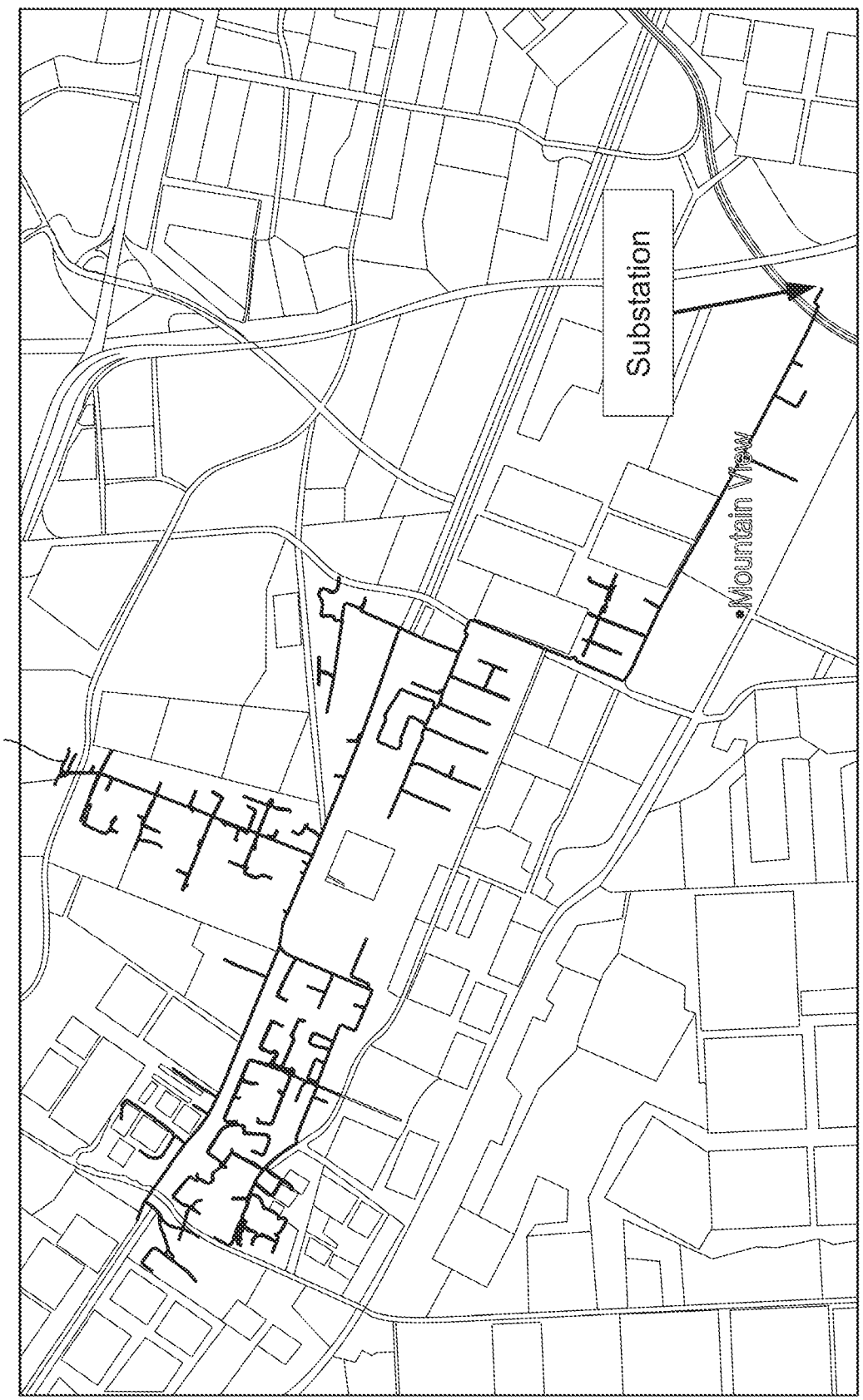
FIG. 1B illustrates an example of a feeder network topology.

FIG. 1B shows an example of a connection topology of a feeder network 112 overlaid on top of an aerial image of a geographic area. As shown in FIG. 1B, the feeder network 112 delivers electric power from a distribution substation to multiple locations across multiple streets.

In many instances, multiple different feeder networks from the same distribution substation or from different distribution substations can be spatially overlapped in the same geospatial area. This means that the electrical assets and loads in the same geospatial area can be connected to different feeder networks. In order to accurately map connections of assets and loads of an electric grid, it is important to have information on the feeder network partitions of the electrical assets and loads. However, this information often is not readily available.

Figure 1C:
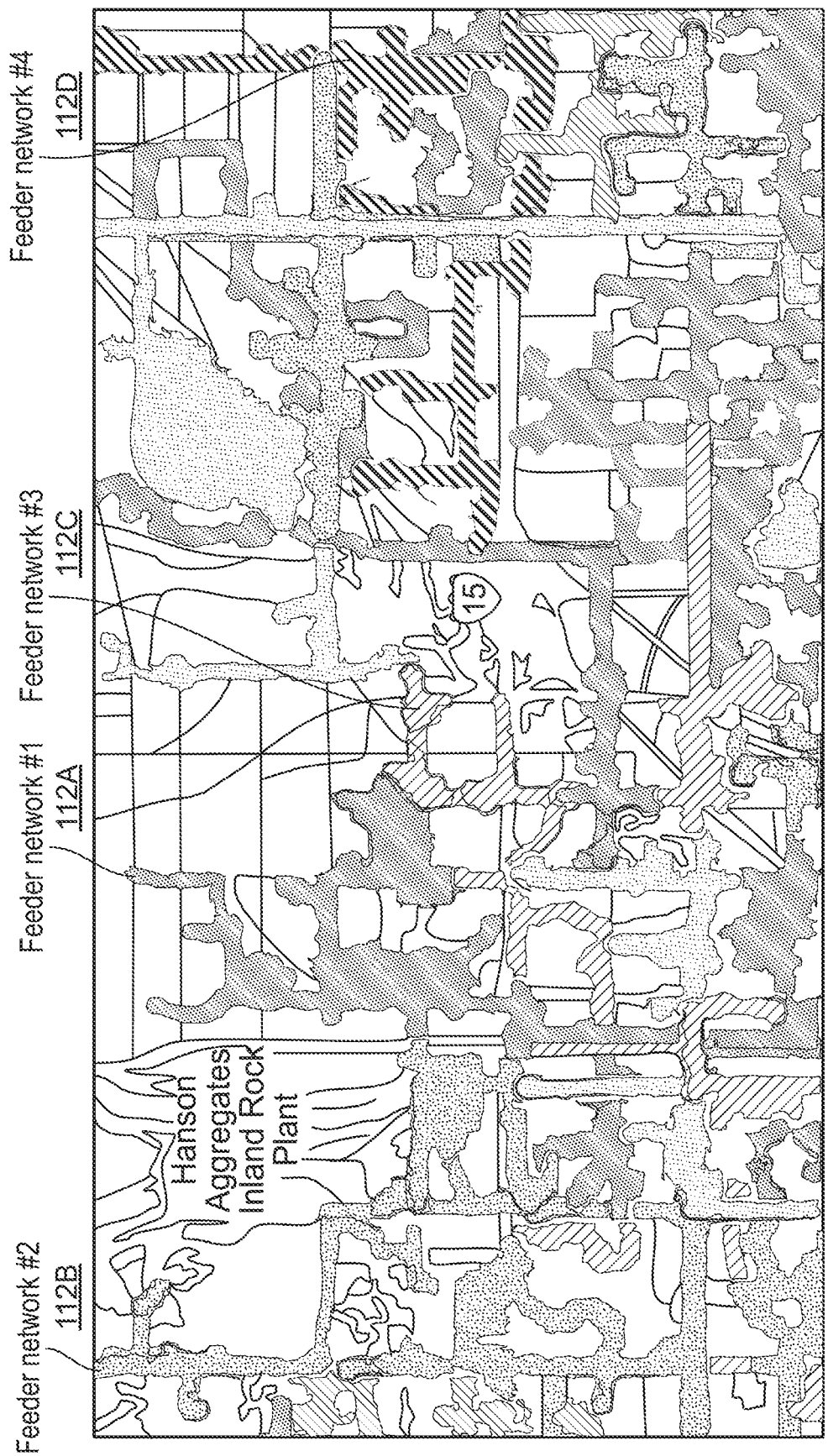
FIG. 1C illustrates an example of multiple spatially overlapping feeder networks.

FIG. 1C shows an example of connection topologies of multiple feeder networks in a geographic area. As shown in FIG. 1C, the spans of the multiple feeder networks, e.g., networks 112A, 112B, 112C, and 112D can significantly overlap within the geographic area to form a complex grid topology. Without feeder network partition information, it is very difficult to accurately map the connectivity topology of the electric grid in the area.

Referring back to FIG. 1A, the system 100 can obtain the asset data 150 by using a publicly available data source, a partner-provided data source, or a proprietary data source. For example, the system 100 can obtain publicly available or partner-provided geospatial data 110 including, e.g., overhead aerial images or street view photos of the geographic area. The system 100 can use an asset detection engine 140 to generate the asset data 150 using the geospatial data 110. For example, the asset detection engine 140 can include an object detection machine-learning model to process a model input specifying the geospatial data 110 to generate a model output specifying the asset data 150. The object detection machine-learning model has been trained using training data to detect electrical assets from images. In some examples, the object detection machine-learning model can include a neural network, e.g., a convolutional neural network.

The asset data 150 specifies, for each of a plurality of electrical assets of the electrical power distribution system, data indicating one or more characteristics, for example, the location and the type of the electrical asset.

In order to generate the partition data 170, the system further obtains sensor data 120 for the electric power distribution system. The sensor data 120 includes measurement data from a plurality of electric sensors.

In some examples, the plurality of sensors include one or more powerline sensors. Each powerline sensor repetitively measures one or more electric parameters through a power line of the electric power distribution system at a plurality of measurement time points. The sensor data can include, for example, electric parameters (e.g., current or voltage) measured from a first line carrying a first of a three-phase electric power transmission and/or the electric parameters measured from a second line carrying a second of the three-phase electric power transmission. The powerline sensor can be incorporated with a GPS sensor that provides a location of the powerline sensor and/or plurality of respective time stamps for the plurality of measurement time points.

In another example, the plurality of sensors includes one or more utility meter sensors installed at one or more respective load locations. Each utility meter sensor repetitively measures power consumption at the respective load location at a plurality of measurement time points. In some examples, the sensor can be an Advanced Metering Infrastructure (AMI) sensor installed at a particular location of the electric power distribution system, and repetitively measures one or more electric parameters at a plurality of measurement time points.

The plurality of sensors can include one or more high-frequency electric sensors configured to respectively measure one or more time-dependent waveforms of the electric parameters.

In addition to the measurement data, the sensor data 120 further includes sensor information for each of the plurality of sensors, including, for example, the location of the sensor, an address associated with the sensor, a type of the sensor, or a sensor ID.

In some implementations, the system 100 further obtains load data 130 for the electric power distribution system in the geographic area. The load data includes, for each of a plurality of load locations of the electrical power distribution system, data indicating one or more characteristics, for example, the location, the address, or the account information, of the load location.

The system 100 uses a partition generation engine 160 to process the asset data 150, the sensor data 120, and the load data 130 to generate partition data 170 that specifies how to group the electrical assets/loads into particular partitions. For example, the partition data can specify, for each of the plurality of electrical assets, an assignment that assigns the electrical asset to one of a set of feeder networks. Examples of the operations of the partition generation engine 160 will be described in more detail with reference to FIG. 2.

In some implementations, after the partition generation engine 160 generates an initial partition result for the electrical assets and/or loads, the partition generation engine 160 further performs a fine-tuning process to enhance the accuracy of the partitions using pole locations. For example, the system 100 can determine one or more pole locations from the geospatial data. For each pole location, the system determines a subset of the plurality of electrical assets located at the pole location based on the geospatial data. The system 100 further determines one or more feeders located at the pole location based on the geospatial data and the initial partition result. If the system determines that a single feeder is located at the pole location, the system updates the partition data to indicate the subset of the plurality of electrical assets being connected to the single feeder.

Once the partition data 170 has been generated the system 100 can use a connection mapping engine 180 to process at least a portion of the partition data 170, the asset data 150, and the load data 130 to generate an output 190 that includes data characterizing network connectivity characteristics of the electric power grid. Examples of the operations of the connection mapping engine 180 will be described in more detail with reference to FIG. 2.

Figure 2:
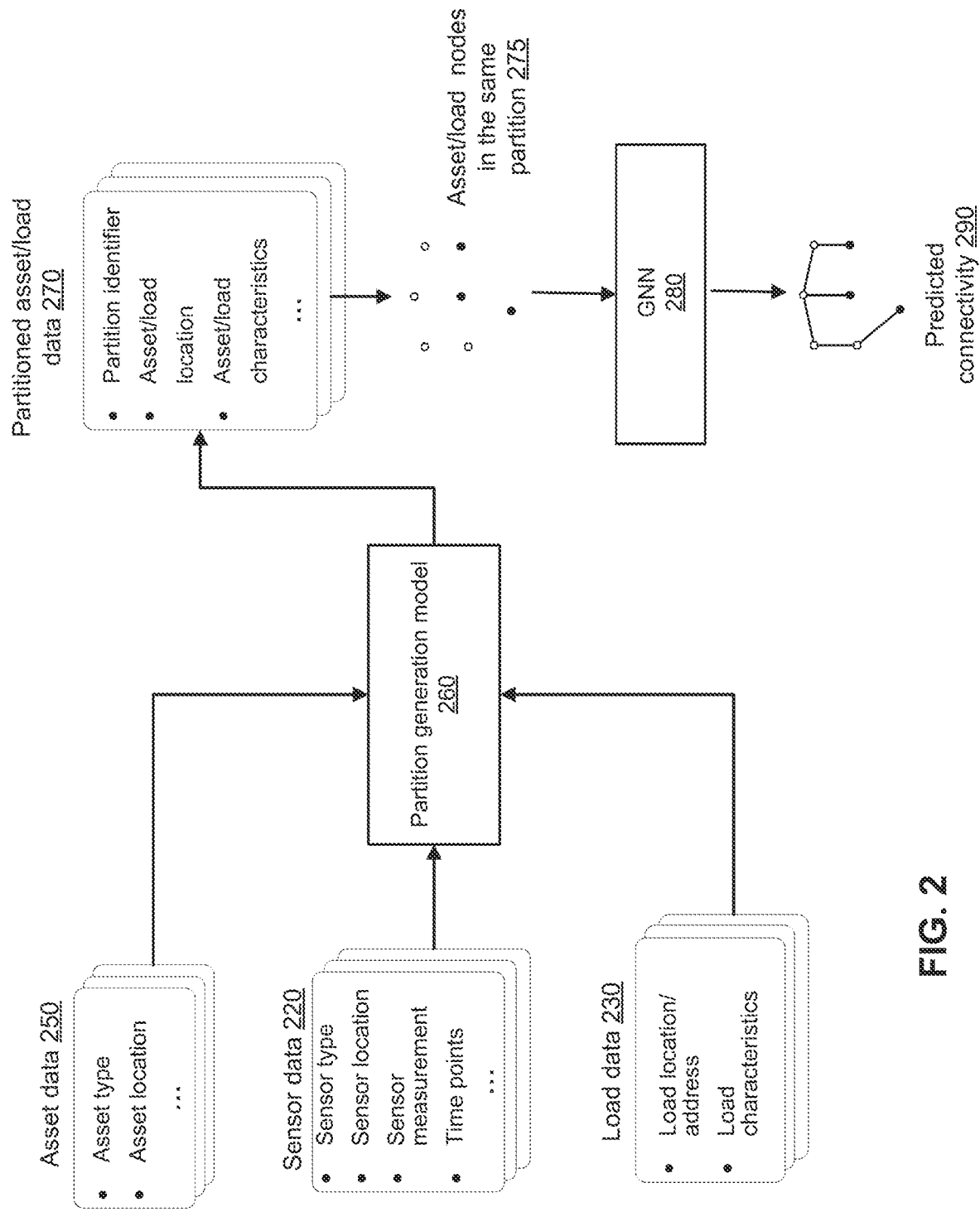
FIG. 2 illustrates an example process for mapping connections of electrical assets and loads.

FIG. 2 illustrates example processes for performing partitioning of the electrical assets and loads (e.g., performed by the partition generation engine 160 described with reference to FIG. 1A) and mapping the connectivity characteristics of the electrical assets and the loads (e.g., performed by the connection mapping engine 180 described with reference to FIG. 1A). For convenience, these processes will be described as being performed by a system of one or more computers located in one or more locations. For example, the system 100 described with reference to FIG. 1A, appropriately programmed in accordance with this specification, can perform these processes.

As shown in FIG. 2, the system can use a partition generation model 260 to process a model input specifying the asset data 250, the sensor data 220, and the load data 230 to partition the electrical assets and/or loads.

In some implementations, the partition generation model 260 can be a machine-learning model. That is, the partition generation model has been trained using training data to perform the partition. In some examples, the partition generation machine-learning model can include a neural network, e.g., a multilayer perceptron (MLP).

In some implementations, the partition generation model 260 can be a correlation model. The system can perform a correlation analysis of the measurement data from each of the plurality of electric sensors to generate a correlation result between each pair of the plurality of electric sensors. For example, the correlation result between a pair of electric sensors includes a waveform correlation between the measurement data from the pair of electric sensors. In another example, the correlation result between a pair of electric sensors includes a temporal correlation of electric outages indicated by the measurement data from the pair of electric sensors. The system can obtain association data that indicates connectivity or geographical associations between each of the plurality of electric sensors with one of the electrical assets or with one of the load locations, and generates the partition data based on the correlation results and the association data. In particular, if the system determines that a correlation between the measurement data from a first electric sensor associated with a first electrical asset or a first load location and the measurement data from a second electric sensor associated with a second electrical asset or a second load location exceeds a threshold, the system can assign the first asset or load location and the second electrical asset or load location to the same feeder network.

The system can generate partitioned asset and/or load data 270 from the output of the partition generation model 260. For example, the partitioned asset and/or load data 270 includes, for each asset or load, data identifying the partition of the asset/load belongs to and data characterizing the asset/load.

The system can use a graphic neural network (GNN) 280 to process partitioned asset and/or load data 270 to generate predicted connectivity 290 of assets and/or loads that have been partitioned into the same feeder network. The GNN has been trained using training data in a training process. For using the GNN 280, the system can generate a model input 275 that includes node feature data for a plurality of nodes for the assets and loads in the same partition. The plurality of nodes can include a plurality of asset nodes, and the node feature data for each asset node indicates a plurality of asset characteristics of an electrical asset in the partition. The plurality of nodes can further include a plurality of load nodes, and the node feature data for each load node indicates characteristics of the electric load. The output of the GNN 280 can include a connectivity feature (e.g., whether there is a connection) for each of a plurality of edges each connecting a pair of the plurality of nodes.

In some implementations, the output of the GNN 280 further includes data characterizing one or more properties of one or more connection edges, such as a power rating, a line impedance, and/or line length of the one or more connection paths.

In some implementations, the output of the GNN 280 further includes an updated node feature for each node. The updated node feature can indicate features such as one or more electrical assets or loads connected to the node, and/or phase characteristics of current through the node.

Figure 3:
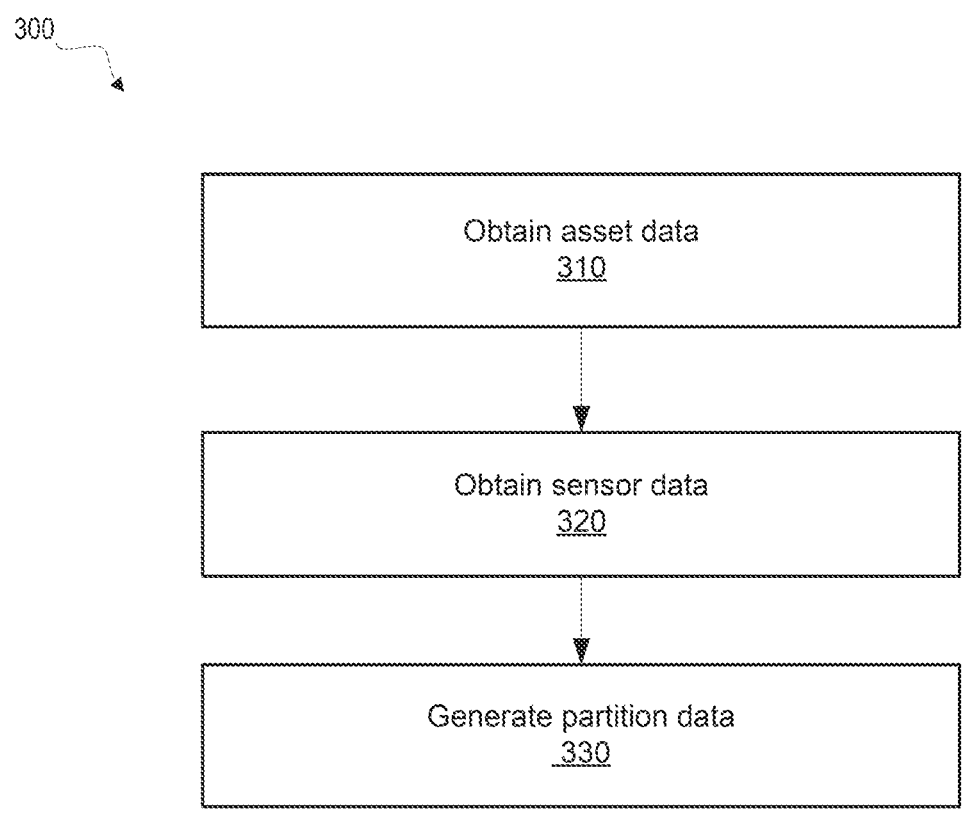
FIG. 3 is a flow diagram illustrating an example process for mapping connections of an electric grid.

FIG. 3 is a flow diagram illustrating an example process 300 for mapping connections of an electric grid. For convenience, the process 300 will be described as being performed by a system of one or more computers located in one or more locations. For example, the system 100 described with reference to FIG. 1A, appropriately programmed in accordance with this specification, can perform the process 300.

In step 310, the system obtains asset data for an electric power distribution system in a geographic area. The asset data includes: for each of a plurality of electrical assets of the electrical power distribution system, data indicating one or more characteristics of the electrical asset. For example, the system can obtain the asset data by processing an overhead aerial image of the geographic area (and optionally additional street view images of the area) using an analysis model to detect power lines, poles, and electrical assets including, e.g., transformers, capacitors, switches, reclosers, fuses, insulators, risers, and voltage regulators.

In step 320, the system obtains sensor data for the electric power distribution system. The sensor data includes measurement data from a plurality of electric sensors. The sensor data includes measurement data from a plurality of electric sensors, including, but not limited to, utility meter sensors, powerline sensors, Advanced Metering Infrastructure (AMI) sensors, and sensors having high-frequency sampling rates and capable of measuring temporal waveforms of electric parameters such as current and voltage waveforms.

In step 330, the system generates, by processing the asset data and the sensor data, partition data that includes, for each of the plurality of electrical assets, an assignment that assigns the electrical asset to one of a set of feeder networks. For example, the system can perform a correlation analysis of the measurement data from each of the plurality of electric sensors to generate a correlation result between each pair of the plurality of electric sensors. The system can generate the partition data based on the correlation results and association data that indicates connectivity or geographical associations between each of the plurality of electric sensors with one of the electrical assets. In another example, the system can generate a model input based on the asset data and the sensor data, and process the model input using a partition machine learning model to generate the partition data.

Figure 4:
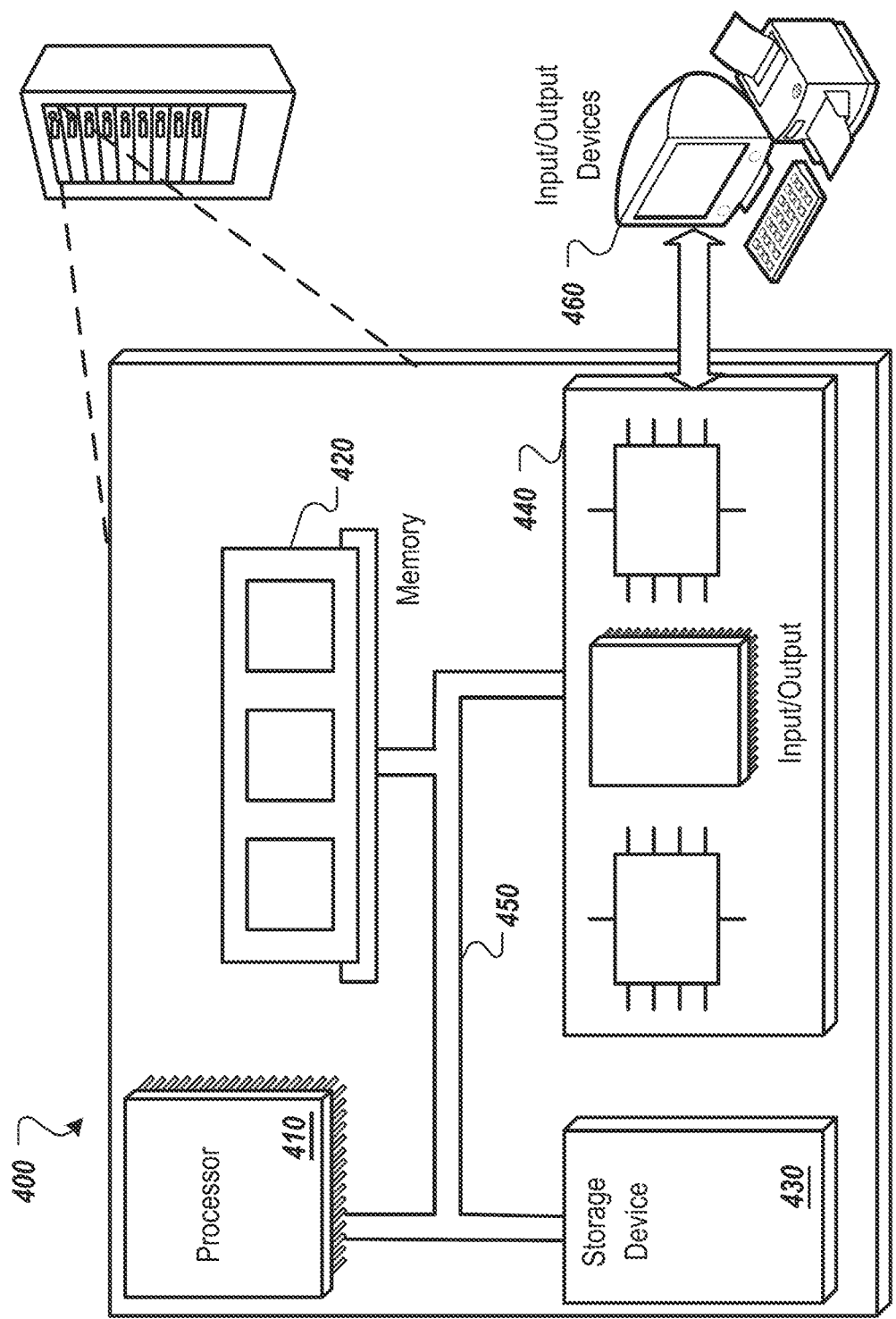
FIG. 4 shows an example computer system for mapping connections of an electric grid.

FIG. 4 shows an example computer system 400 that can be used to perform certain operations described above, for example, to perform the operations of the system 100 of FIG. 1A. The system 400 includes a processor 410, a memory 420, a storage device 430, and an input/output device 440. Each of the components 410, 420, 430, and 440 can be interconnected, for example, using a system bus 450. The processor 410 is capable of processing instructions for execution within the system 400. In one implementation, the processor 410 is a single-threaded processor. In another implementation, the processor 410 is a multi-threaded processor. The processor 410 is capable of processing instructions stored in the memory 420 or on the storage device 430.

The memory 420 stores information within the system 400. In one implementation, the memory 420 is a computer-readable medium. In one implementation, the memory 420 is a volatile memory unit. In another implementation, the memory 420 is a non-volatile memory unit.

The storage device 430 is capable of providing mass storage for the system 400. In one implementation, the storage device 430 is a computer-readable medium. In various different implementations, the storage device 430 can include, for example, a hard disk device, an optical disk device, a storage device that is shared over a network by multiple computing devices (for example, a cloud storage device), or some other large-capacity storage device.

The input/output device 440 provides input/output operations for the system 400. In one implementation, the input/output device 440 can include one or more network interface devices, for example, an Ethernet card, a serial communication device, for example, a RS-232 port, and/or a wireless interface device. In another implementation, the input/output device can include driver devices configured to receive input data and send output data to other input/output devices, for example, keyboard, printer and display devices 460. Other implementations, however, can also be used, such as mobile computing devices, mobile communication devices, set-top box television client devices, etc.

Although an example system has been described in FIG. 4, implementations of the subject matter and the functional operations described in this specification can be implemented in other types of digital electronic circuitry, or in computer software, firmware, or hardware, including the structures disclosed in this specification and their structural equivalents, or in combinations of one or more of them.

Although the disclosed inventive concepts include those defined in the attached claims, it should be understood that the inventive concepts can also be defined in accordance with the following embodiments.

Embodiment 1 is a method for generating a representation of an electric power grid. The method includes: obtaining asset data for an electric power distribution system in a geographic area, where the asset data includes, for each of a plurality of electrical assets of the electrical power distribution system, data indicating one or more characteristics of the electrical asset; obtaining sensor data for the electric power distribution system, where the sensor data includes measurement data from a plurality of electric sensors; and generating, based on the asset data and the sensor data, partition data that includes, for each of the plurality of electrical assets, an assignment that assigns the electrical asset to one of a set of feeder networks.

Embodiment 2 is a method of embodiment 1. The method further includes: obtaining load data for the electric power distribution system in the geographic area, the load data including: for each of a plurality of load locations of the electrical power distribution system, data indicating one or more characteristics of the load location. The partition data further includes: for each of the plurality of load locations, an assignment that assigns the electric load location to one of a set of feeder networks.

Embodiment 3 is a method of embodiment 2. In Embodiment 3, generating the partition data includes: performing a correlation analysis of the measurement data from each of the plurality of electric sensors to generate a correlation result between each pair of the plurality of electric sensors; obtaining association data that indicates connectivity or geographical associations between each of the plurality of electric sensors with one of the electrical assets or with one of the load locations; and generating the partition data based on the correlation results and the association data.

Embodiment 4 is a method of embodiment 3. In embodiment 4, the correlation result between a pair of electric sensors comprises a waveform correlation between the measurement data from the pair of electric sensors.

Embodiment 5 is a method of embodiments 3 or 4. In embodiment 5, the correlation result between a pair of electric sensors comprises a temporal correlation of electric outages indicated by the measurement data from the pair of electric sensors.

Embodiment 6 is a method of any of embodiments 3-5. In embodiment 6, generating the partition data based on the correlation results and the association data includes: in response to determining that a correlation between the measurement data from a first electric sensor associated with a first electrical asset or a first load location and the measurement data from a second electric sensor associated with a second electrical asset or a second load location exceeds a threshold, assigning the first asset or load location and the second electrical asset or load location to a same feeder network.

Embodiment 7 is a method of any preceding embodiments. In embodiment 7, generating the partition data includes: generating a model input that comprises at least a portion of the asset data and at least a portion of the sensor data; and processing the model input using a partition machine learning model to generate the partition data.

Embodiment 8 is a method of any preceding embodiments. The method of embodiment 8 further includes: generating model input data based on at least a portion of the asset data and at least a portion of the partition data; and processing the model input data using a connection mapping machine learning model to generate an output that comprises data characterizing network connectivity characteristics for the plurality of electrical assets.

Embodiment 9 is a method of embodiment 8. In embodiment 9, the output further includes data characterizing network connectivity characteristics for the plurality of load locations.

Embodiment 10 is a method of any of embodiments 8 or 9. In embodiment 10, the output further comprises data characterizing one or more properties of one or more connection paths.

Embodiment 11 is a method of embodiment 10. In embodiment 11, the one or more properties includes: a power rating, a line impedance, or line length of the one or more connection paths.

Embodiment 12 is a method of any of embodiments 8-11. In embodiment 12, the model input data includes node feature data for a plurality of nodes. The plurality of nodes include a plurality of asset nodes, and the node feature data includes: for each electrical asset, an asset node feature that indicates a plurality of asset characteristics of the electrical asset. Processing the model input data includes processing the model input data using a graph neural network to generate a connectivity feature for each of a plurality of edges each connecting a pair of the plurality of nodes.

Embodiment 13 is a method of embodiments 12. In embodiment 13, the asset characteristics of the electrical asset further comprises one or more of: a geospatial location of the electrical asset; a type of the electrical asset; an electric rating of the electrical asset; an ID of the electrical asset; or an image feature of the electrical asset.

Embodiment 14 is a method of embodiments 12 or 13. In embodiment 13, the plurality of nodes are in a same feeder network according to the partition data.

Embodiment 15 is a method of any of embodiments 12-14. In embodiment 15, the plurality of nodes include a plurality of load nodes, and the node feature data includes: for each of a plurality of loads, a load node feature that indicates a load characteristic of the node.

Embodiment 16 is a method of any of embodiments 12-15. In embodiment 16, the graph neural network further generates an updated node feature for each node, the updated node feature indicating one or more of: one or more electrical assets or loads connected to the node; or phase characteristics of current through the node.

Embodiment 17 is a method any of the preceding embodiments. In embodiment 17, obtaining the asset data includes: obtaining geospatial data characterizing the geographic area; and performing image analysis to identify the plurality of electrical assets and the one or more characteristics for each of the plurality of electrical assets.

Embodiment 18 is a method of embodiment 17. In embodiment 18 performing the image analysis includes: using an object detection machine learning model to process the geospatial data to generate an output indicating a plurality of detected electrical assets.

Embodiment 19 is a method of embodiments 17 or 18. In embodiment 19, the geospatial data comprises an overhead aerial image of the geographic area.

Embodiment 20 is a method of embodiment 19. In embodiment 20, the geospatial data further includes one or more street view images of the geographic area.

Embodiment 21 is a method of any of embodiments 17-20. The method of embodiment 21 further includes: determining one or more pole locations from the geospatial data; and for each pole location: determining a subset of the plurality of electrical assets located at the pole location based on the geospatial data; determining one or more feeders located at the pole location based the geospatial data and the partition data; and in response to determining that a single feeder is located at the pole location, updating the partition data to indicate the subset of the plurality of electrical assets being connected to the single feeder.

Embodiment 22 is a method of any of the preceding embodiments. In embodiment 22, the plurality of sensors includes one or more powerline sensors. Each powerline sensor repetitively measures one or more electric parameters through a power line of the electric power distribution system at a plurality of measurement time points.

Embodiment 23 is a method of embodiment 22. In embodiment 23, the sensor data includes: the electric parameters measured from a first line carrying a first of a three-phase electric power transmission; and the electric parameters measured from a second line carrying a second of the three-phase electric power transmission.

Embodiment 24 is a method of embodiments 22 or 23. In embodiment 24, each powerline sensor is incorporated with a GPS sensor that provides one or more of: a location of the powerline sensor; or a plurality of respective time stamps for the plurality of measurement time points.

Embodiment 25 is a method of any of the preceding embodiments. In embodiment 25, the plurality of sensors comprises one or more utility meter sensors installed at one or more respective load locations, wherein each utility meter sensor repetitively measures a power consumption at the respective load location at a plurality of measurement time points.

Embodiment 26 is a method of any of the preceding embodiments. In embodiment 26, the plurality of sensors comprises one or more Advanced Metering Infrastructure (AMI) sensors installed at a plurality of locations of the electric power distribution system. Each AMI sensor repetitively measures one or more electric parameters at a plurality of measurement time points.

Embodiment 27 is a method of any of the preceding embodiments. In embodiment 27, the plurality of sensors comprises one or more high-frequency electric sensors. Each high-frequency electric sensors respectively measures one or more time-dependent waveforms of the one or more electric parameters.

Embodiment 28 is a method of any of the preceding embodiments. In embodiment 28, the sensor data further comprises sensor information for each of the plurality of sensors.

Embodiment 29 is a method of embodiments 28. In embodiment 29, the sensor information comprises one or more of: a location of the sensor; an address associated with the sensor; a type of the sensor; or a sensor ID.

Embodiment 30 is a method of any of the preceding embodiments. In embodiment 30, the plurality of electrical assets comprises one or more of: a transformer; a capacitor; a switch; a recloser; a fuse; an insulator; a riser; or a voltage regulator.

Embodiment 31 is a method of any of the preceding embodiments. In embodiment 31, obtaining the asset data includes one or more of: obtaining the asset data from a partner-provided data source; or obtaining the asset data from a publicly available data source.

Embodiment 32 is a system including one or more computers and one or more storage devices storing instructions that when executed by the one or more computers cause the one or more computers to perform the operations of the respective method of embodiments 1-31.

Embodiment 33 is one or more computer storage media storing instructions that when executed by one or more computers cause the one or more computers to perform the operations of the respective method of the claims.

This specification uses the term "configured" in connection with systems and computer program components. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by a data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, that is, one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, for example, a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, for example, an FPGA (field programmable gate array) or an ASIC (application-specific integrated circuit). The apparatus can optionally include, in addition to hardware, code that creates an execution environment for computer programs, for example, code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand-alone program or as a module, component, subroutine, or other unit suitable for use in a computing environment. A program may, but need not, correspond to a file in a file system. A program can be stored in a portion of a file that holds other programs or data, for example, one or more scripts stored in a markup language document, in a single file dedicated to the program in question, or in multiple coordinated files, for example, files that store one or more modules, sub-programs, or portions of code. A computer program can be deployed to be executed on one computer or on multiple computers that are located at one site or distributed across multiple sites and interconnected by a data communication network.

In this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, for example, an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a personal digital assistant (PDA), a mobile audio or video player, a game console, a Global Positioning System (GPS) receiver, or a portable storage device, for example, a universal serial bus (USB) flash drive, to name just a few.

Computer-readable media suitable for storing computer program instructions and data include all forms of non-volatile memory, media and memory devices, including by way of example semiconductor memory devices, for example, EPROM, EEPROM, and flash memory devices; magnetic disks, for example, internal hard disks or removable disks; magneto-optical disks; and CD-ROM and DVD-ROM disks.

To provide for interaction with a user, embodiments of the subject matter described in this specification can be implemented on a computer having a display device, for example, a CRT (cathode ray tube) or LCD (liquid crystal display) monitor, for displaying information to the user and a keyboard and a pointing device, for example, a mouse or a trackball, by which the user can provide input to the computer. Other kinds of devices can be used to provide for interaction with a user as well; for example, feedback provided to the user can be any form of sensory feedback, for example, visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of messages to a personal device, for example, a smartphone that is running a messaging application and receiving responsive messages from the user in return.

Data processing apparatus for implementing machine learning models can also include, for example, special-purpose hardware accelerator units for processing common and compute-intensive parts of machine learning training or production, that is, inference, workloads.

Machine learning models can be implemented and deployed using a machine learning framework, for example, a TensorFlow framework, a Microsoft Cognitive Toolkit framework, an Apache Singa framework, or an Apache MXNet framework.

Embodiments of the subject matter described in this specification can be implemented in a computing system that includes a back-end component, for example, as a data server, or that includes a middleware component, for example, an application server, or that includes a front-end component, for example, a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, for example, a communication network. Examples of communication networks include a local area network (LAN) and a wide area network (WAN), for example, the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, for example, an HTML page, to a user device, for example, for purposes of displaying data to and receiving user input from a user interacting with the device, which acts as a client. Data generated at the user device, for example, a result of the user interaction, can be received at the server from the device.

While this specification contains many specific implementation details, these should not be construed as limitations on the scope of any features or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method for generating a representation of an electric power grid, comprising:
    obtaining asset data for an electric power distribution system in a geographic area, the asset data comprising: for each of a plurality of electrical assets of the electrical power distribution system, data indicating one or more characteristics of the electrical asset;
    obtaining sensor data for the electric power distribution system, comprising measurement data from a plurality of electric sensors;
    obtaining load data for the electric power distribution system in the geographic area, the load data comprising: for each of a plurality of load locations of the electrical power distribution system, data indicating one or more characteristics of the load location;
    generating, based on the asset data and the sensor data, partition data comprising:
        for each of the plurality of electrical assets, an assignment that assigns the electrical asset to one of a set of feeder networks, and
        for each of the plurality of load locations, an assignment that assigns the electric load location to one of a set of feeder networks,
    wherein generating the partition data comprises:
        performing a correlation analysis of the measurement data from each of the plurality of electric sensors to generate a correlation result between each pair of the plurality of electric sensors, wherein the correlation result between a pair of electric sensors comprises a temporal correlation of electric outages indicated by the measurement data from the pair of electric sensors;
        obtaining association data that indicates connectivity or geographical associations between each of the plurality of electric sensors with one of the electrical assets or with one of the load locations; and
        generating the partition data based on the correlation results and the association data;
    generating, based on the partition data, a connection model of the electric power grid;
    generating, using the connection model, a prediction of one or more of operations or faults of the electric power grid; and
    providing the prediction for display on an output device.

2. The method of claim 1, wherein the correlation result between a pair of electric sensors comprises a waveform correlation between the measurement data from the pair of electric sensors.

3. The method of claim 1, wherein generating the partition data based on the correlation results and the association data comprises:
in response to determining that a correlation between the measurement data from a first electric sensor associated with a first electrical asset or a first load location and the measurement data from a second electric sensor associated with a second electrical asset or a second load location exceeds a threshold, assigning the first asset or load location and the second electrical asset or load location to a same feeder network.

4. The method of claim 1, wherein generating the partition data comprises:
generating a model input that comprises at least a portion of the asset data and at least a portion of the sensor data; and
processing the model input using a partition machine learning model to generate the partition data.

5. The method of claim 1, further comprising:
generating model input data based on at least a portion of the asset data and at least a portion of the partition data; and
processing the model input data using a connection mapping machine learning model to generate an output that comprises data characterizing network connectivity characteristics for the plurality of electrical assets.

6. The method of claim 5, wherein the output further comprises data characterizing network connectivity characteristics for a plurality of load locations.

7. The method of claim 5, wherein the output further comprises data characterizing one or more properties of one or more connection paths.

8. The method of claim 7, wherein the one or more properties comprise: a power rating, a line impedance, or line length of the one or more connection paths.

9. The method of claim 5, wherein:
the model input data comprises node feature data for a plurality of nodes, wherein the plurality of nodes include a plurality of asset nodes, and the node feature data comprises: for each electrical asset, an asset node feature that indicates a plurality of asset characteristics of the electrical asset; and
processing the model input data comprises processing the model input data using a graph neural network to generate a connectivity feature for each of a plurality of edges each connecting a pair of the plurality of nodes.

10. The method of claim 9, wherein the plurality of nodes are in a same feeder network according to the partition data.

11. The method of claim 9, wherein the graph neural network further generates an updated node feature for each node, the updated node feature indicating one or more of:
one or more electrical assets or loads connected to the node; or
phase characteristics of current through the node.

12. The method of claim 1, further comprising:
determining one or more pole locations from geospatial data; and
for each pole location:
determining a subset of the plurality of electrical assets located at the pole location based on the geospatial data;
determining one or more feeders located at the pole location based on the geospatial data and the partition data; and
in response to determining that a single feeder is located at the pole location, updating the partition data to indicate the subset of the plurality of electrical assets being connected to the single feeder.

13. The method of claim 1, wherein the plurality of sensors comprises one or more powerline sensors, wherein each powerline sensor repetitively measures one or more electric parameters through a power line of the electric power distribution system at a plurality of measurement time points.

14. The method of claim 1, wherein the plurality of sensors comprises one or more utility meter sensors installed at one or more respective load locations, wherein each utility meter sensor repetitively measures a power consumption at the respective load location at a plurality of measurement time points.

15. The method of claim 1, wherein the sensor data further comprises sensor information for each of the plurality of sensors, and the sensor information comprises one or more of:
a location of the sensor;
an address associated with the sensor;
a type of the sensor; or
a sensor ID.

16. A system comprising one or more computers and one or more storage devices storing instructions that when executed by the one or more computers cause the one or more computers to perform operations comprising:
obtaining asset data for an electric power distribution system in a geographic area, the asset data comprising: for each of a plurality of electrical assets of the electrical power distribution system, data indicating one or more characteristics of the electrical asset;
obtaining sensor data for the electric power distribution system, comprising measurement data from a plurality of electric sensors;
obtaining load data for the electric power distribution system in the geographic area, the load data comprising: for each of a plurality of load locations of the electrical power distribution system, data indicating one or more characteristics of the load location;
generating, based on the asset data and the sensor data, partition data comprising:
for each of the plurality of electrical assets, an assignment that assigns the electrical asset to one of a set of feeder networks, and
for each of the plurality of load locations, an assignment that assigns the electric load location to one of a set of feeder networks,
wherein generating the partition data comprises:
performing a correlation analysis of the measurement data from each of the plurality of electric sensors to generate a correlation result between each pair of the plurality of electric sensors, wherein the correlation result between a pair of electric sensors comprises a temporal correlation of electric outages indicated by the measurement data from the pair of electric sensors;
obtaining association data that indicates connectivity or geographical associations between each of the plurality of electric sensors with one of the electrical assets or with one of the load locations; and
generating the partition data based on the correlation results and the association data;

generating, based on the partition data, a connection model of the electric power grid;

generating, using the connection model, a prediction of one or more of operations or faults of the electric power grid; and providing the prediction for display on an output device.

17. One or more computer storage media storing instructions that when executed by one or more computers cause the one or more computers to perform operations comprising:

obtaining asset data for an electric power distribution system in a geographic area, the asset data comprising: for each of a plurality of electrical assets of the electrical power distribution system, data indicating one or more characteristics of the electrical asset;

obtaining sensor data for the electric power distribution system, comprising measurement data from a plurality of electric sensors;

obtaining load data for the electric power distribution system in the geographic area, the load data comprising: for each of a plurality of load locations of the electrical power distribution system, data indicating one or more characteristics of the load location;

generating, based on the asset data and the sensor data, partition data comprising:

for each of the plurality of electrical assets, an assignment that assigns the electrical asset to one of a set of feeder networks, and for each of the plurality of load locations, an assignment that assigns the electric load location to one of a set of feeder networks, wherein generating the partition data comprises:

performing a correlation analysis of the measurement data from each of the plurality of electric sensors to generate a correlation result between each pair of the plurality of electric sensors, wherein the correlation result between a pair of electric sensors comprises a temporal correlation of electric outages indicated by the measurement data from the pair of electric sensors;

obtaining association data that indicates connectivity or geographical associations between each of the plurality of electric sensors with one of the electrical assets or with one of the load locations; and generating the partition data based on the correlation results and the association data;

generating, based on the partition data, a connection model of the electric power grid;

generating, using the connection model, a prediction of one or more of operations or faults of the electric power grid; and providing the prediction for display on an output device.

* * * * *